United States Patent
Bushong et al.

[11] Patent Number: 6,125,551
[45] Date of Patent: Oct. 3, 2000

[54] GAS SEAL AND SUPPORT FOR ROTATING SEMICONDUCTOR PROCESSOR

[75] Inventors: James R. C. Bushong, Laguna Beach; Mario S. Manriquez, Victorville, both of Calif.

[73] Assignee: Verteq, Inc., Santa Ana, Calif.

[21] Appl. No.: 09/040,176

[22] Filed: Mar. 17, 1998

[51] Int. Cl.[7] .................................................. F26B 5/08
[52] U.S. Cl. .................................... 34/318; 34/58; 34/242
[58] Field of Search .............................. 34/312, 313, 318, 34/320, 325, 58, 60, 61, 63, 242, 406

[56] References Cited

U.S. PATENT DOCUMENTS

| | | |
|---|---|---|
| 3,347,604 | 10/1967 | Lavelle et al. . |
| 3,383,255 | 5/1968 | Rossi et al. . |
| 3,489,608 | 1/1970 | Jacobs et al. . |
| 3,760,822 | 9/1973 | Evans . |
| 3,808,065 | 4/1974 | Robinson et al. . |
| 3,964,957 | 6/1976 | Walsh . |
| 3,970,471 | 7/1976 | Bankes et al. . |
| 3,974,797 | 8/1976 | Hutson . |
| 4,027,686 | 6/1977 | Shortes et al. . |
| 4,092,176 | 5/1978 | Kozai et al. . |
| 4,099,727 | 7/1978 | Weiler . |
| 4,132,567 | 1/1979 | Blackwood . |
| 4,197,000 | 4/1980 | Blackwood . |
| 4,199,154 | 4/1980 | Mueller . |
| 4,300,581 | 11/1981 | Thompson . |
| 4,571,850 | 2/1986 | Hunt et al. ................................. 34/242 |
| 4,884,899 | 12/1989 | Schwartzman ........................... 384/100 |
| 5,022,419 | 6/1991 | Thompson et al. . |
| 5,171,026 | 12/1992 | Starrick ..................................... 277/57 |
| 5,339,539 | 8/1994 | Shiraishi et al. ........................... 34/58 |

OTHER PUBLICATIONS

Verteq, Inc., Spin Dryers brochure, Mar. 1997: SuperClean 8201.

Tempress Microelectronics, Installation and Service Manual: Model 425.

*Primary Examiner*—Denise L. Ferensic
*Assistant Examiner*—Michelle A. Mattera
*Attorney, Agent, or Firm*—Knobbe, Martens, Olson & Bear, LLP

[57] ABSTRACT

A rotating wafer processor uses a non-contacting gas seal mounted to a process chamber and a vibration isolation mount between the chamber and a support structure. The non-contacting seal incorporates a housing with a chamfer on opposing ends of an annular land encircling a rotating drive shaft, and one or more outlet ports on the chamfers to form a gas-purged, noncontacting seal. The seal is directly mounted to the chamber and interposed between the chamber and bearings that support the drive shaft, so the shaft, chamber and rotating load vibrate together.

31 Claims, 10 Drawing Sheets

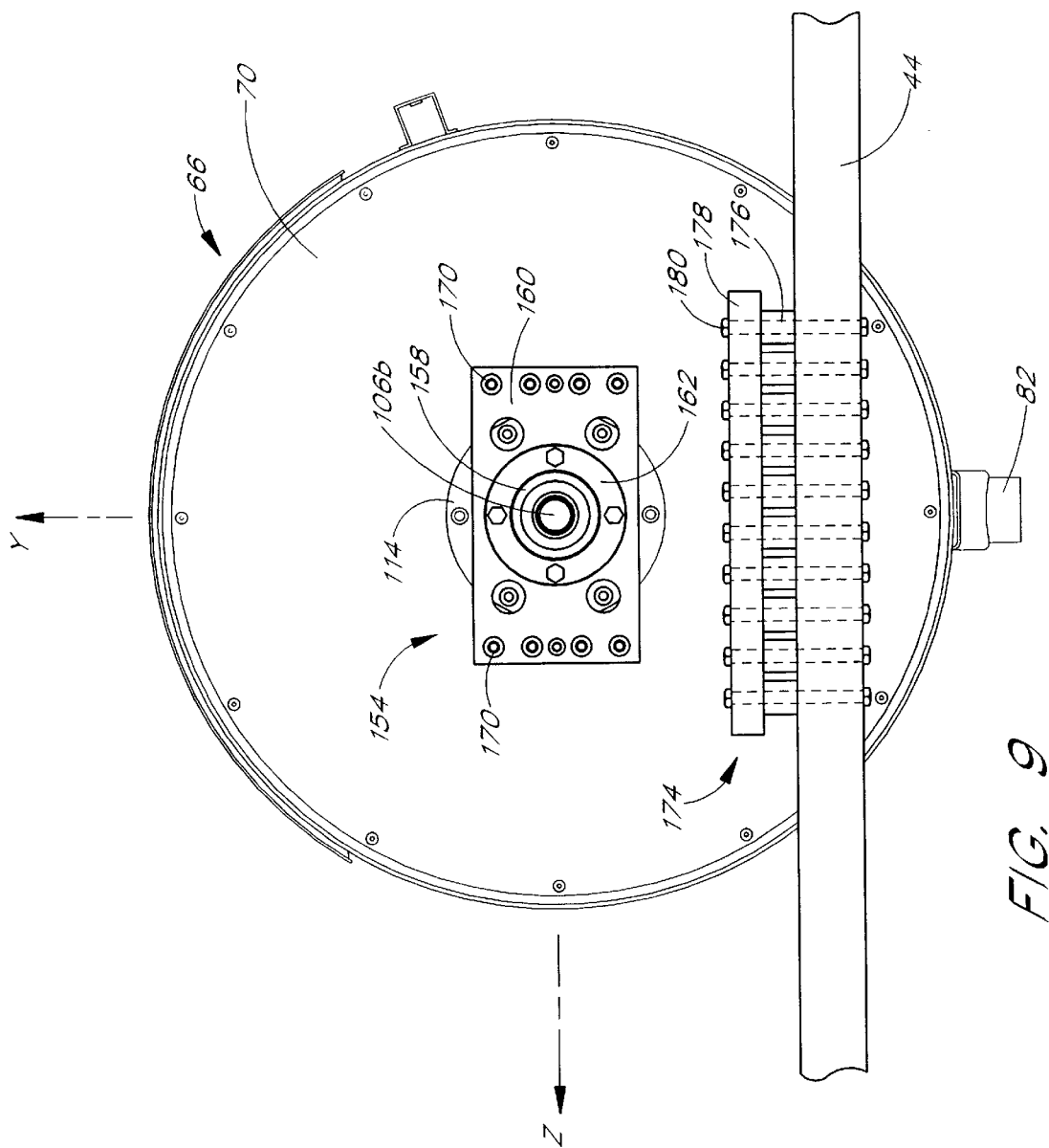

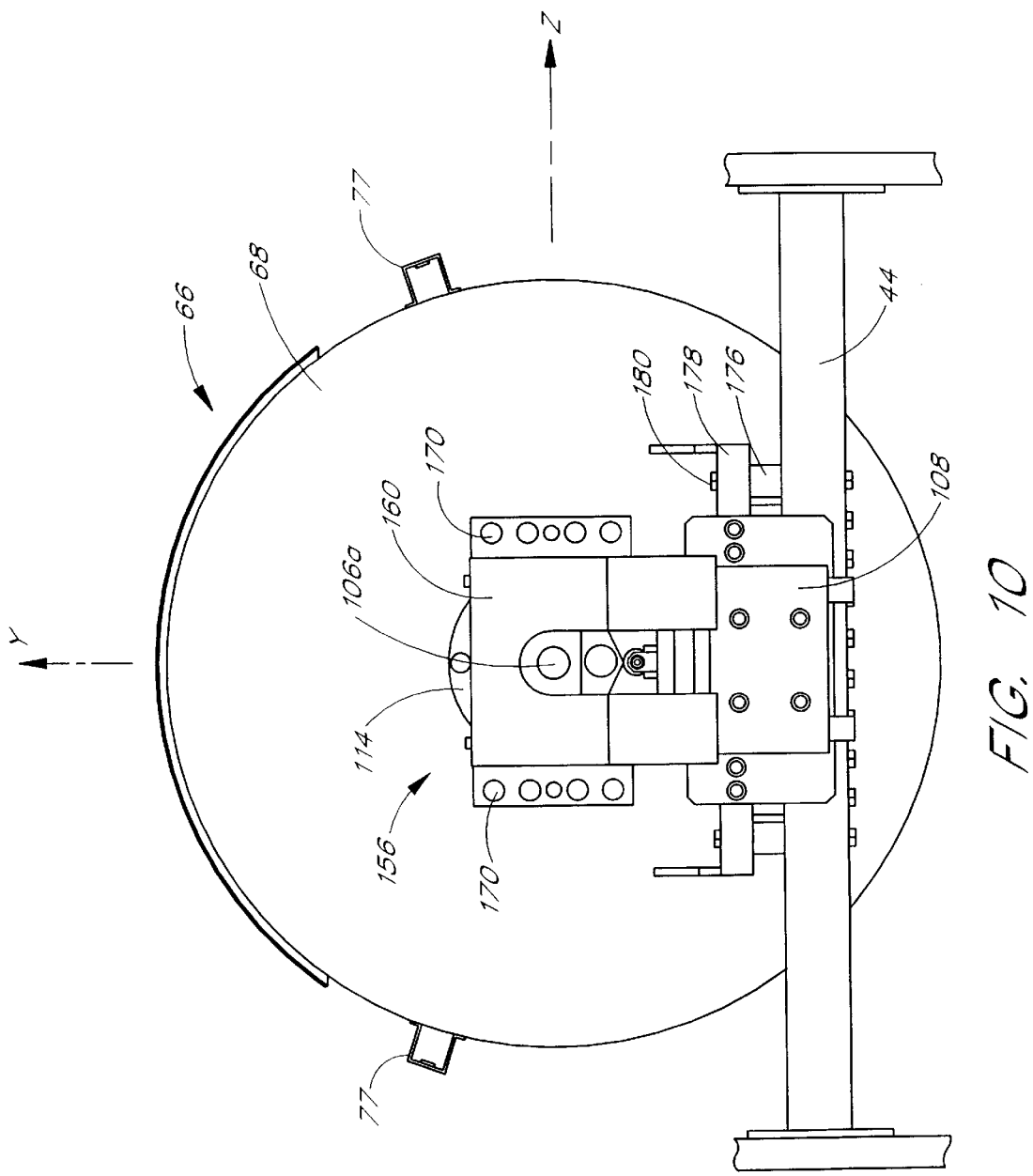

GAS SEAL AND SUPPORT FOR ROTATING SEMICONDUCTOR PROCESSOR

BACKGROUND OF THE INVENTION

1. Field of the Invention

The present invention relates in general to a gas seal and support for a rotating semiconductor processor and, more particularly, to a gas seal and support for a rotating rinser-dryer system.

2. Description of the Prior Art

In the production of integrated circuits, circular wafers or substrates are processed through multiple steps before being cut into segments to form the integrated circuits. The semiconductor wafers are typically circular in shape, and generally 0.02 to 0.04 inch thick, from 6 to 12 inches in diameter, and made of silicon. Accordingly, the large, thin wafers are very fragile.

The deposition of materials upon these fragile substrates requires that the semiconductors be coated with numerous solutions and then rinsed and dried. For example, processing can include steps in which layers of material are masked, deposited, processed, etched, polished or various combinations of these steps. It is important that the wafers remain extremely clean during these various processing steps. To remove undesired chemicals between various processing steps, the semiconductors often undergo a rinsing and drying cycle during which a plurality of wafers are placed in a wafer carrier, rotated, and sprayed with processing fluids during the rotation. It is important during these processing steps that the wafer handling neither damage the wafers or the circuits being formed on the wafers, nor introduce any particles or contaminants. Vibration of the wafers and wafer carrier is one major source of movement that can generate particles. There is thus a need for a semiconductor processor that controls vibration to reduce particle generation.

Contaminants can also be created when rotating wafer carriers contact adjacent structure, or when the drive shaft that rotates the wafer carriers contacts any adjacent structure. Any contact between the rotating drive shaft and the stationary bowl or chamber enclosing the wafer carrier, can cause particle generation which contaminates the semiconductors. Initially, low friction ferro-fluidic seals were used to reduce contaminants from the rotating shaft seal, but they proved inadequate as the size of the circuitry became smaller and the size and number of permissible contaminants became smaller.

In some cases, combinations of contacting and noncontacting seals were used, as well as noncontacting pressurized gas seals. But these noncontacting gas seals are characterized by relatively large sealing areas between the bowl and the motor shaft. Alternatively, if the seal is placed along the length of the shaft then the gap between the rotating shaft and adjacent structure must accommodate shaft motion. Small spacings between parts conserves gas usage, but generates particles when the rotating shaft contacts the stationary processing bowl. If the gap is made larger, then gas pressure and gas consumption increases which adds significant cost to the use of these processing systems. There is thus a need for a gas pressurized, noncontacting seal that has a close spacing to reduce gas consumption, but which accommodates movement of the rotating shaft.

Another problem with rotating processing systems is the vibration caused by the rotating motor, shaft and wafer carrier inside a stationary bowl or chamber. For a variety of reasons the rotating wafers and wafer carrier are typically not balanced, and that unbalance generates vibration. Sometimes wafers are offset from the center of rotation in order to seat the wafers against the carrier. Sometimes different numbers of wafers are placed in the carrier. Sometimes parts bend and cause an imbalance. In all cases, the vibration can cause undesirable movement that generates contaminants.

Further, the vibration of these rotating parts can adversely affect not only the wafers within the processing chamber, but adjacent machinery used in the manufacture of the semiconductors. There is thus a need for a rotating processor that reduces the vibration transmitted to adjacent equipment.

In particular, a need exists for a rotating processor that uses a noncontacting seal with a small sealing area and low gas consumption, and which further reduces the undesirable transmission of vibrations to adjacent equipment.

SUMMARY OF THE INVENTION

The present invention provides a rotatable semiconductor processor which uses a noncontacting, gas purged seal that allows movement of a rotating drive shaft while reducing consumption of the purge gas. Further, the rotating components, the stationary bowl and the motor are mounted in a manner that reduces vibration transmission from the processor to adjacent structures and equipment.

The processing bowl or chamber is resiliently mounted to a support frame, preferably at opposing ends of the bowl, while the drive motor and rotating components are rigidly mounted to the support frame. The motor is connected to a rotating drive shaft that advantageously extends into the stationary chamber and through a pair of noncontacting, gas purged seals directly mounted to opposing walls of the chamber. The resulting vibratory motion transmitted from the rotating components to the frame to the floor upon which the support frame rests, is believed to be lower than for comparable prior art rotating processors which mount the bowl directly to the frame and resiliently mount the motor or rotating shaft to the frame.

Rotatably mounting the rotating shaft to the chamber, close to the seal, also helps reduce relative motion between the seal and the shaft and thus enables smaller tolerances. The improved noncontacting seal incorporates a smaller sealing area which requires smaller amounts of pressure and/or gas flow to form an adequate seal around the rotating drive shaft. These aspects improve the cost effectiveness of the rinser-dryer system and reduce contamination from particulates. This gap extends the length of a substantially flat land that is generally concentric with the rotating shaft. The length of the land is preferably short. Chamfered surfaces on opposing sides of the gap allow the rotating shaft room to move on opposing sides of this land, and effectively rotate about the land—preferably with the land located at a vibrational node.

In accordance with one aspect of the semiconductor processor, the semiconductor processor comprises a rotor capable of securing one or a plurality of semiconductors wafers in a bowl which houses the rotor and incorporates a moveable door. A shaft is attached to the rotor along a rotational axis to rotate the rotor. A noncontacting seal is arranged so that the shaft may pass through the seal. The seal encircles the rotating shaft and is gas purged to form one gas flow directed towards the bowl and one away from the bowl. At least one pressure ridge is disposed between the shaft and the housing to inhibit migration of particulates across the pressure ridge(s). Advantageously, the pressure ridge occurs at a flat land between two inclined surfaces that taper away from the shaft. The seal is preferably mounted to the bowl, very close to the rotatable support that is also mounted to the bowl to rotatably support the rotation shaft, rotor and wafers.

BRIEF DESCRIPTION OF THE DRAWINGS

The present invention will be better understood from the description of the illustrated embodiments taken in conjunction with the drawings in which like reference characters or numbers refer to like parts throughout the description, and in which:

FIG. 9 is a view of the rinser-dryer illustrated in FIG. 1 along lines 9—9 of FIG. 1.

FIG. 10 is a plan view of a the rinser-dryer taken along lines 10—10 of FIG. 1.

DETAILED DESCRIPTION OF THE ILLUSTRATED EMBODIMENTS

The semiconductor processor is discussed in the context of a rinser-dryer 8, but it should be understood that the present invention is applicable to other rotating processing systems. Thus, the illustration and description of the gas purged, noncontacting seal and vibration isolation system in connection with a rinser-dryer system 8 is exemplary of one possible application of the system.

Figure 1:
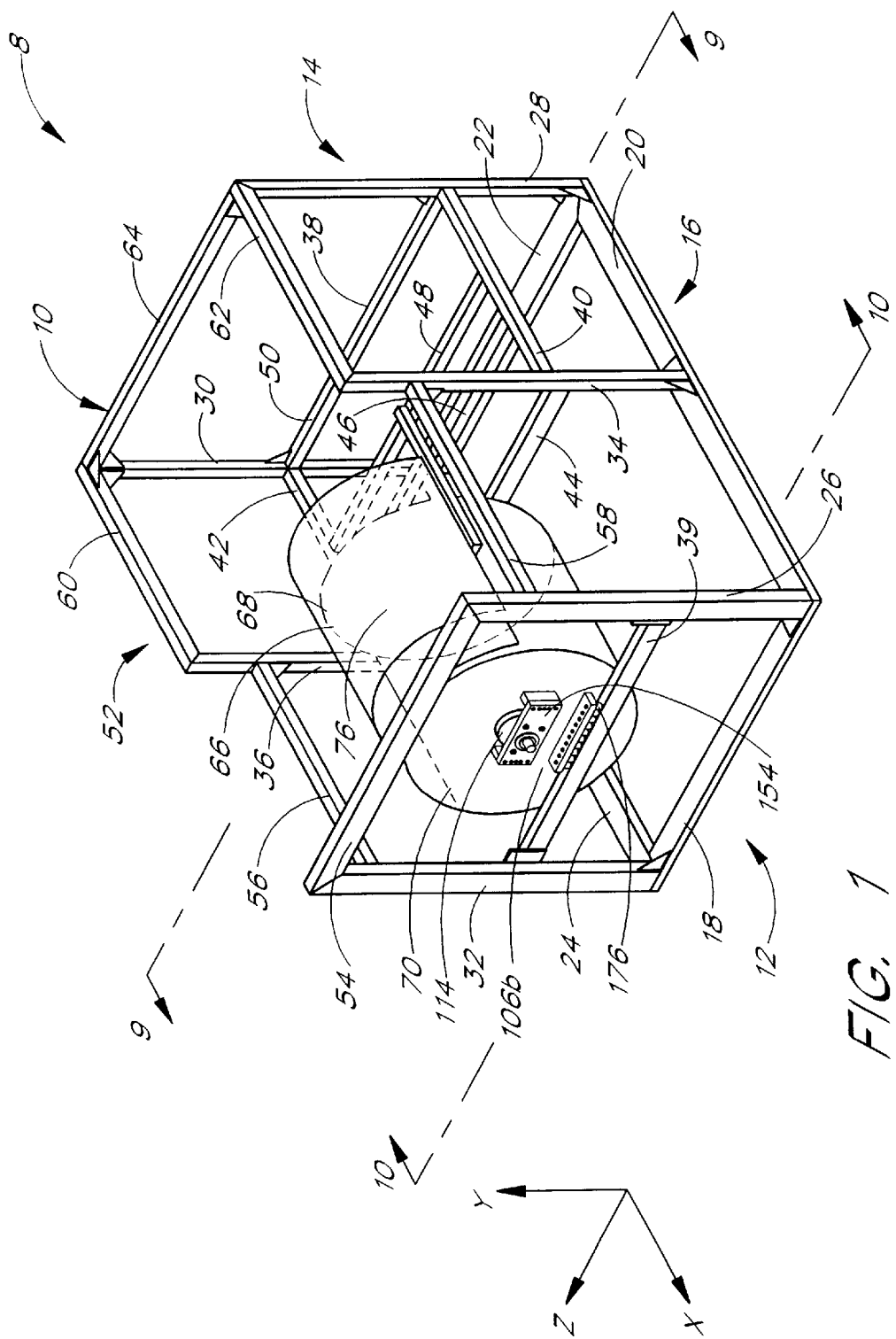
FIG. 1 is a perspective view of a rinser-dryer.

To assist in the description of the components of the rinser-dryer system, the following coordinate terms are used. Referring to FIG. 1, a longitudinal axis of rotation X—X extends along the longitudinal axis of a rotating semiconductor processor, such as drive shaft 106 of a rinser-dryer 8. A substantially vertical axis Y—Y is generally perpendicular to the longitudinal axis and extends along the vertical height of the rinser-dryer 8, with an orthogonal axis Z—Z extending along the depth of the rinser-dryer 8.

Referring to FIGS. 1–6, the rinser-dryer 8 has a processing chamber illustrated as a generally cylindrical bowl 66. The bowl 66 houses a rotor 84 (FIG. 3) mounted to rotate inside the bowl 66. The rotor 84 holds one or more wafer carriers 104 (FIG. 4) having a plurality of slots that are aligned so that each slot can removably receive one or more wafers for processing. The rotor 84 can also accommodate a carrier-less configuration.

Figure 5:
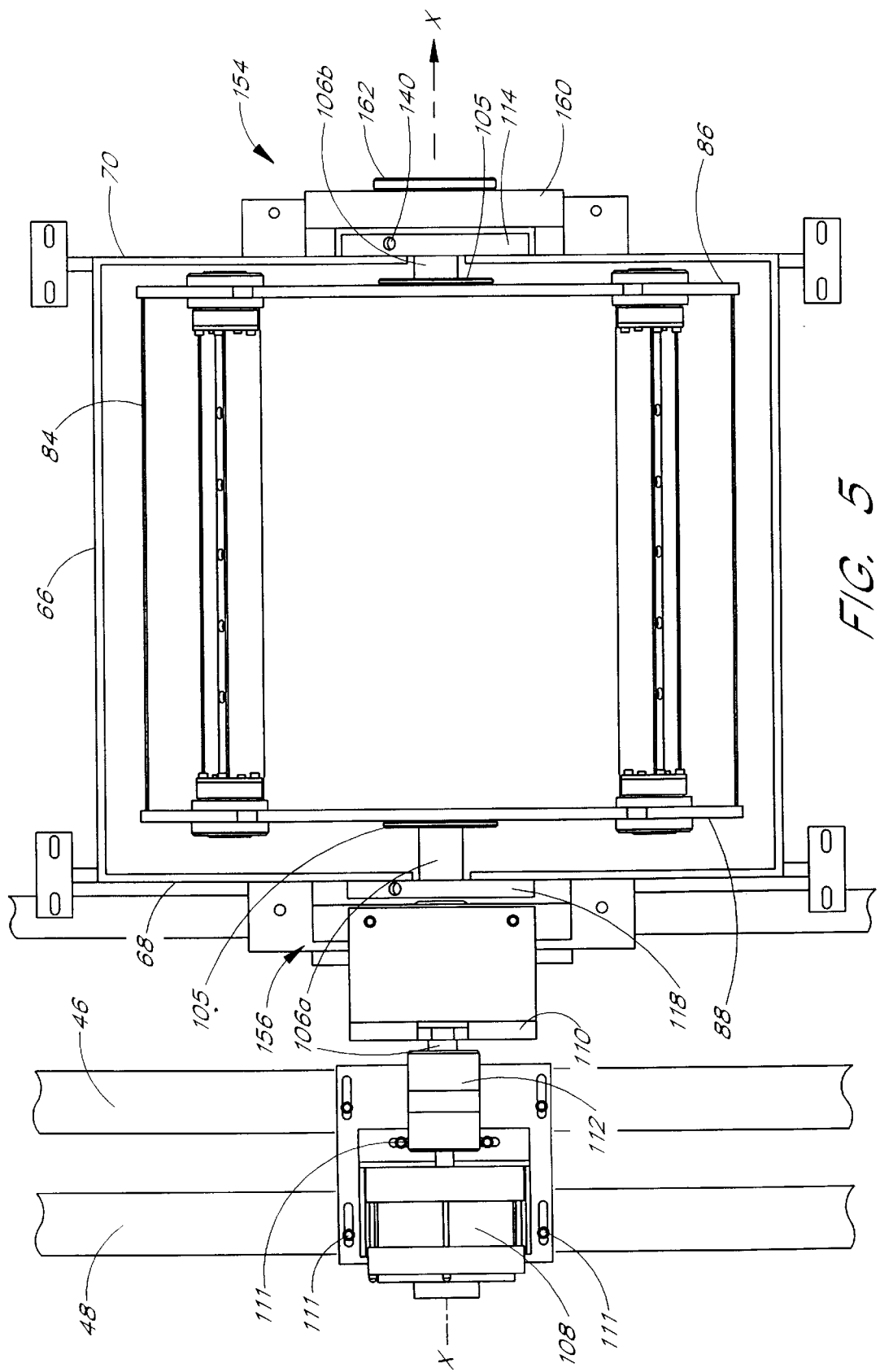
FIG. 5 is a top view of the rinser-dryer illustrated in FIG. 1 with the top of the bowl removed to show the rotor.
Figure 6:
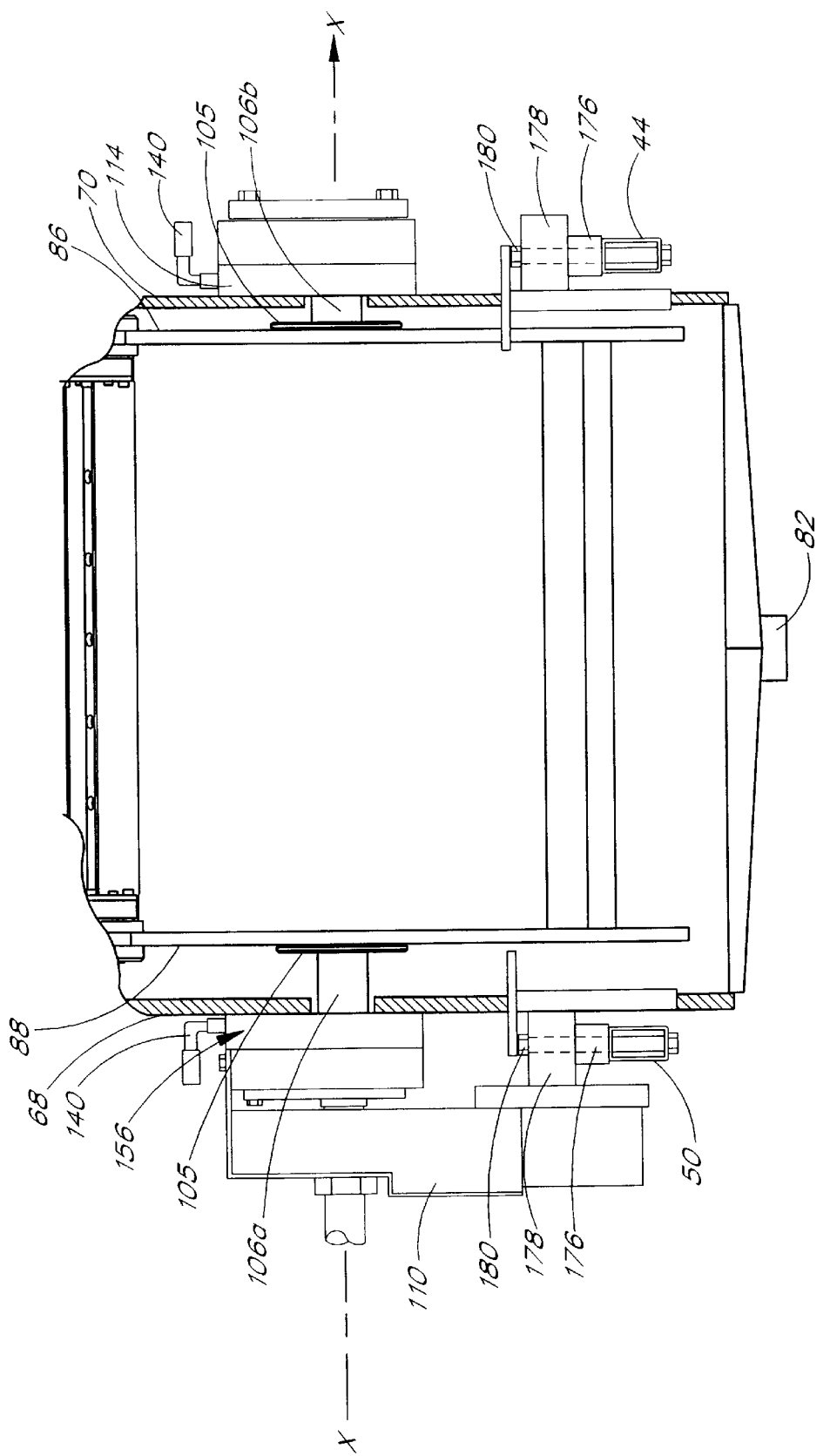
FIG. 6 is a side view of the rinser-dryer illustrated in FIG. 1 with the cover and the side of the bowl removed to show the rotor.

The rotor 84 and wafers are rotated about a shaft 106 connected to a motor 108 (FIG. 5). This arrangement allows the shaft 106 to pass through openings 72 and 74 in the front and rear ends of the bowl 66 and connect to opposing ends of rotor 84. Seal housings 114 and 118 are located on opposing exterior ends of the bowl 66 to seal the rotating shaft 106 so contaminants do not enter the bowl 66. The shaft 106 is rotatably mounted to the bowl 66 close to the seal housing 114 and 118, by mounts 156 and 158 (FIG. 6).

As illustrated in FIG. 1, a frame 10 is configured to support the bowl 66. The frame 10 has a forward portion 12 and a rearward portion 14 and includes a base 16. The base 16 is formed by a plurality of base members positioned on or adjacent to a floor. Preferably, a first 18, second 20, third 22 and fourth 24 base members are arranged in a rectangular design to form the base 16. However, other geometric configurations, such as a square or circle may be used. Corner members extend from the base members 18, 20, 22, and 24 in a vertically upstanding direction to define the corners of the rinser-dryer 8. The illustrated embodiment depicts a first 26, second 28, third 30 and fourth 32 corner member arranged on the corners of the base 16. Supplemental members also extend from the base members 18, 20, 22, and 24 in a vertically upstanding direction. Preferably, a first supplemental member 34 is positioned longitudinally between the first corner member 26 and the second corner member 28, and a second supplemental member 36 is positioned longitudinally between the third corner member 30 and the fourth corner member 32.

A rear intermediate support 38 is located vertically above and parallel to the base 16, preferably 12 to 36 inches above the base 16. The rear intermediate support 38 is formed by a plurality of intermediate members which extend along the rearward portion 14 of the frame 10 for approximately one half the length of the frame 10 as measured along longitudinal X—X axis. Preferably, a first intermediate member 40 is longitudinally disposed between and attached to the first supplemental member 34 and the second corner member 28, a second intermediate member 42 is longitudinally disposed between and attached to the second supplemental member 36 and the third corner member 30, a third intermediate member 44 is laterally disposed between and attached to the first supplemental member 34 and the second supplemental member 36, a fourth 46 and fifth 48 intermediate member is laterally disposed between and attached to the first intermediate member 40 and the second intermediate member 42, a sixth intermediate member 50 is laterally disposed between and attached to the second corner member 28 and the third corner member 30.

A front intermediate support 39 is located vertically above and parallel to the base 16, preferably 12 to 36 inches above the base 16. The front intermediate support 39 is disposed between and connected to the first corner member 26 and the fourth corner member 32.

An upper support 52 is formed by a plurality of members which connect the upstanding corner members 26, 28, 30 and 32 and supplemental members 34 and 36 to form a top to the rinser-dryer system. Preferably, the upper support 52 comprises six members wherein the first upper member 54 is laterally disposed between and attached to the first corner member 26 and the fourth corner member 32, the second upper member 56 is laterally disposed between and attached to the fourth corner member 32 and the second supplemental member 36, the third upper member 58 is laterally disposed between and attached to the first corner member 26 and the first supplemental member 34, the fourth upper member 60 is laterally disposed between and attached to the second supplemental member 36 and the third corner member 30, the fifth upper member 62 is laterally disposed between and attached to the first supplemental member 32 second corner members 28, and the sixth upper member 64 is longitudinally disposed between and attached to the second corner members 28 and the third corner member 30. A cover, not shown, is placed over the frame 10 to enclose the frame 10.

The above-described frame 10 need not comprise the specifically recited members. Rather, the only requirement is that the frame 10 support the rinser-dryer system and its component elements. Thus, the frame 10 may comprise a wide variety of members, shapes and sizes such as a plurality of curvilinear members, a unitary body or similar designs which support the rinser-dryer system and its component elements.

If desired, a bottom tray, (not shown) preferably constructed of conventional sheet metal or thin plastic, is arranged parallel to the base 16 and rests atop the base members 18, 20, 22 and 24. A lower tray (not shown) can also be attached to the corner members 26, 28, 30 and 32 and is of similar construction as the bottom tray. The lower tray is preferably positioned parallel to the base 16 and vertically above the bottom tray but below the intermediate support 38. Additional trays advantageously located on the rinser-dryer system may be employed to support rinser-dryer elements or store related items such as tools, spare parts, liquids or the like.

Figure 2:
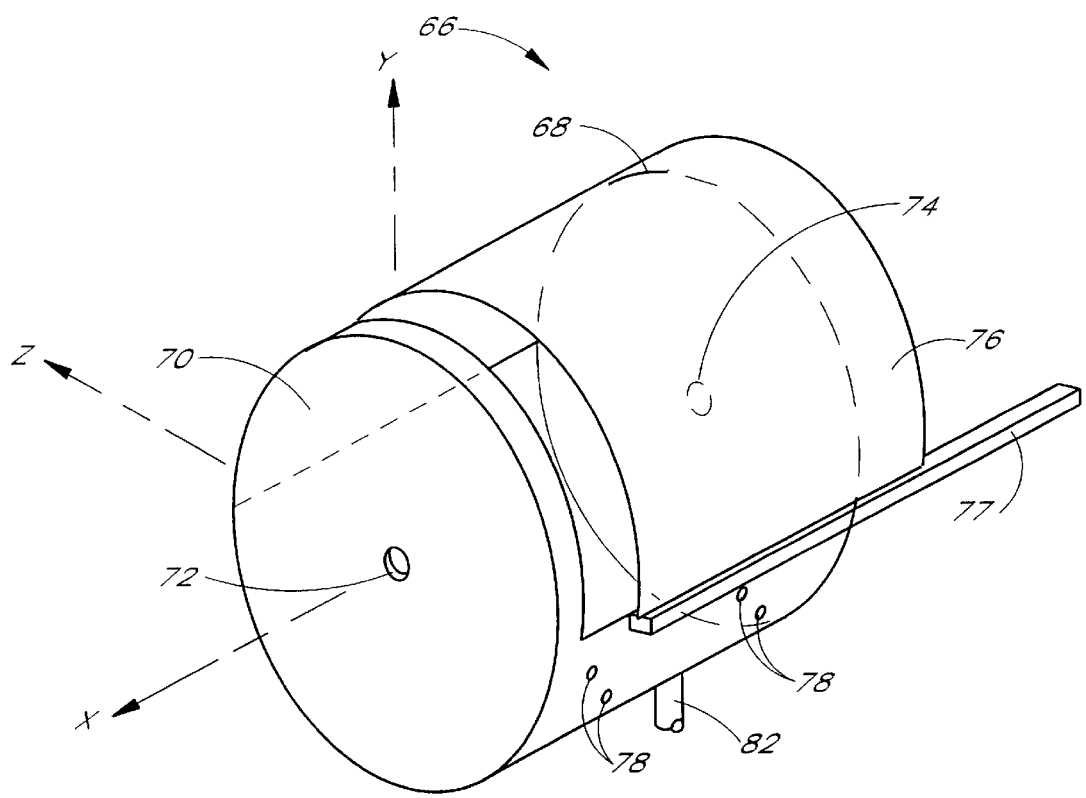
FIG. 2 is a perspective view of a bowl used in the rinser-dryer illustrated in FIG. 1.

As shown in FIGS. 1 and 2, a cylindrical bowl 66 is housed within the rinser dryer 8 toward the forward portion 12 of the frame 10 and extends approximately one-half the length of the frame 10 as measured along the longitudinal axis X—X. The bowl 66 has opposing generally parallel ends 68 and 70 connected to the generally cylindrical sides. The bowl 66 extends above and below the rear intermediate support 38 (which is adjacent to the rear end 68 of the bowl 66). A front opening 72 is formed centrally in the front end 70 of the bowl 66. The front opening 72 advantageously comprises a circle with a diameter of 0.5 to 5 inches and more preferably a diameter of 1 to 3 inches, preferably slightly larger than the corresponding diameter of the shaft 106 that extends through the hole. A rear opening 74 is formed centrally on the rear end 68 of the bowl 66. The rear 74 opening preferably has a diameter of 0.5 to 5 inches and more preferably a diameter of 1 to 3 inches, preferably slightly larger than the corresponding diameter of shaft 106 that extends through the hole. The openings 72 and 74 are on the rotational axis X—X. The openings 72 and 74 need not be circular, rather, other geometries may be used such a square, rectangle, triangle, or other shape suitable to achieve the purposes described herein.

A door 76 is placed on the top of the bowl 66 for easy access into the bowl 66. Preferably, a track 77 (FIG. 2) formed on opposing sides of bowl 66 allows the door 76 to be slid along the X—X axis between an open and closed position. When in the closed position, the door 76 is flush with the curved, generally cylindrical sides of the bowl 66 and is formed to provide continuity to the curved shape of the bowl 66. When opened, the door 76 moves upwardly along the vertical axis Y—Y, radially away from the X—X axis, and then moves along the X—X axis parallel to the bowl 66. Pneumatic cylinders move the door along the Y—Y axis, while linear lead screws, linear pneumatic cylinders or other drive mechanisms move the door along the X—X axis to allow access to the interior of bowl 66. Other opening and closing means, such as a hinged door, may be used in place of the track 77. A pneumatic clamping system (not shown) preferably seals the door 76 in the closed position to form a gas-tight seal which prevents contaminates from entering into the bowl 66 during use. The positioning and sealing of the door 76 is preferably performed by an electronically controlled interface in the form of a conventional controller pad, however, manual means such as a door handle and lock may also be used.

A plurality of rinse and dry nozzles 78 are located on the interior of the bowl 66. More specifically, the nozzles 78 are positioned toward the bottom of the bowl 66 and along either or both sides of the bowl 66. This positioning prevents residual water drip from the rinse nozzles 78 from contacting the wafers. The nozzles 78 spray fluid, most commonly deionized water into the bowl to rinse the wafers during the rinsing cycle. The nozzles 78 also spray fluid, most commonly nitrogen gas (as discussed below), into the bowl 66 to dry the wafers during the drying cycle. Depending on the type of processor involved, different nozzle locations and fluids may be used. An exhaust or drain 82 is located along the bottom interior of the bowl 66. The drain 82 provides egress from the bowl 66 for contaminants, nitrogen, water, or other fluids used in the rotating processor. Depending on the nature of the processing that occurs in the bowl 66, the nozzle design will change to suit the processing needs. For example, rinse nozzles may be formed separately from dry nozzles so that respective rinse and dry ports remain further contamination free for more stringent processing specifications.

Figure 3:
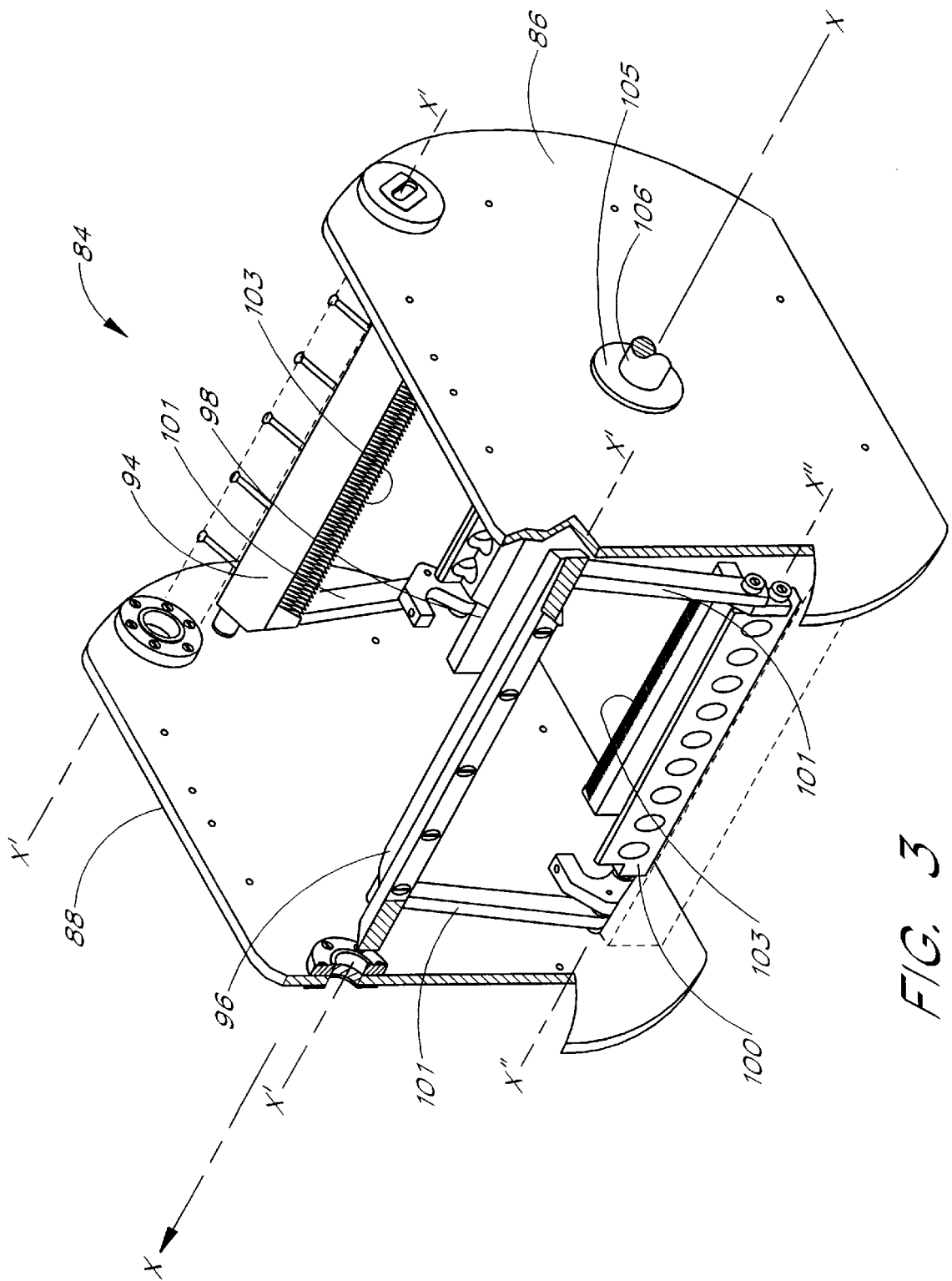
FIG. 3 is a perspective view of a rotor used in the rinser-dryer illustrated in FIG. 1.
Figure 4:
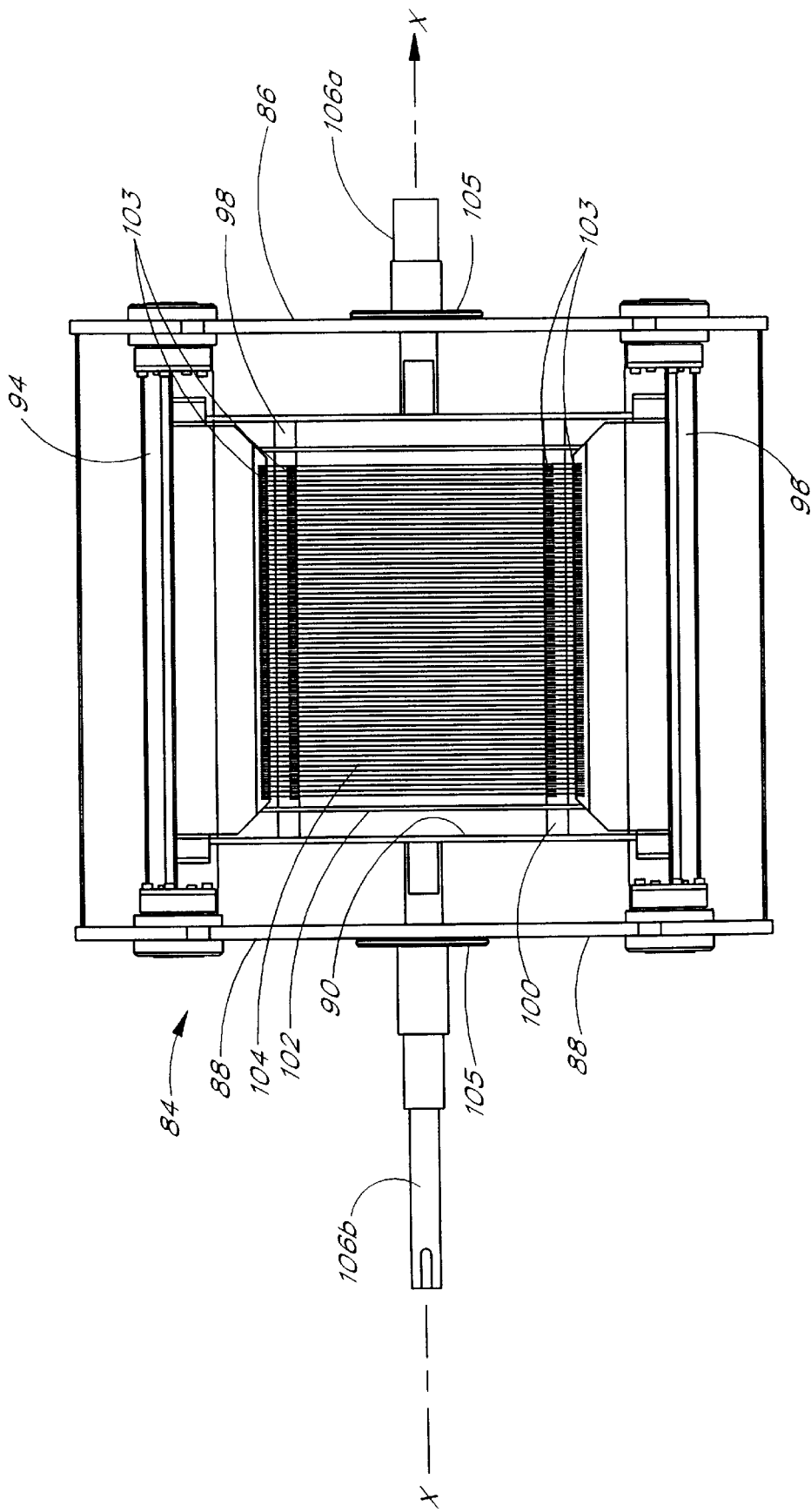
FIG. 4 is a top view of a rotor and wafer carrier and wafers of the rinser-dryer illustrated in FIG. 1.

FIGS. 3 and 4 show a rotatable rotor 84 housed within the bowl 66 (FIG. 1). The rotor 84 has a forward end and a rearward end which longitudinally corresponds to the forward and rearward portions 12 and 14 of the frame 10 (FIG. 1). The ends 88 and 86 are substantially parallel.

The rotor includes a pair of upper retainer bars and a pair of lower retainer bars. The upper bars 94 and 96 connect the ends 86 and 88 of the rotor 84 at opposing sides of the rotor 84 toward the top portion of the rotor 84. The lower retainer bars 98 and 100 connect the ends 86 and 88 of the rotor 84 at opposing sides of the rotor 84 toward the bottom portion of the rotor 84. The bars 94 and 96 can rotate about their rotational axis X'—X'. Each of the bars 94 and 96 is connected to a lower bar 98 and 100 by a linkage bar 101 to form a four-bar linkage. Pneumatic cylinders (not shown) rotate the upper bars 94 and 96 about axis X'—X'. Rotation of bars 94 and 96 cause a tooth-like projection 103 on each bar to engage or disengage wafers in a carrier 104 and hold the wafers secure during rotation when the carrier 104 is placed in the rotor 84. Other wafer retention mechanisms can be used.

The wafer carrier 104 has a plurality of slots to hold a variable number of wafers during the rinser-dryer process, as well as during transportation between other processing steps. The rotor 84, wafer carrier 104 and wafers rotate substantially about longitudinal axis X—X. The rotor 84 may be configured for specific wafers, and the components to hold them, so the entire rotor 84 may be interchanged if the wafer sizes are changed. The center of the wafers are preferably 60 to 80 thousandths of an inch offset from the rotational axis X—X to help seat the wafers during rotation. However, the wafers can be configured with zero offset from the rotational axis X—X.

As shown in FIGS. 4, 5 and 6, one end of the shaft 106*b* is rotatably mounted on the end 70 of the bowl 66 by suitable bearings connected to or mounted off of the end 70, while the opposing end is connected to the rotor 84 by a mounting flange 105. The shaft 106*a* is also rotatably mounted from the opposite end 68 of the bowl 66 by conventional rotational mounting means, with the opposing end of the shaft 106*a* being connected to the rotor 84 by a flange 105. The shaft 106*a* further extends through an indexing mechanism 110 and connects to a coupler 112 driven by a motor 108 to provide a motor directly driving the axial shaft 106 and rotor 84. The coupler 112 accommodates misalignment between the drive shaft of the motor 108 and the shaft 106*a*. By this design, the motor 108 transfers a rotational force to the shaft 106 which in turn rotates the rotor 84 and wafer carrier 104.

The coupler 112 and motor 108 are located on, and secured to supports 44, 46, 48 (FIG. 5) by conventional means such as a clamp, bracket or bolt. Indexing mechanism 110 is supported off the end 68 of the bowl 66 as best seen in FIG. 6. The indexing mechanism 110 controls the shaft rotation so that the wafer carrier 104 comes to a stop in a predetermined orientation so the wafers do not fall out of the carrier 104. Preferably, the motor 108 is rigidly mounted to the frame 10 (FIG. 5) by bolts 111 extending through slots in a plate to which the motor 108 is mounted. The slots allow adjustment of the motor position. The bolts 111 fasten the motor 108 to supports 46, 48 of the frame 10 to rigidly mount the motor 108 to the frame.

A front seal housing 114, advantageously taking the form of a disc, is positioned against the exterior portion of the front end 70 of the bowl 66 and centered on the front opening 72 of the bowl 66. A circular hole 116 (FIG. 7) is formed at the center of the front housing 114. A similarly-shaped rear housing 118 is positioned against the exterior portion of the rear end 68 of the bowl 66 and centered on the rear opening 74 of the bowl 66. A circular hole 116 is also formed at the center of the rear housing 118. The holes 116 are aligned with the openings 72 and 74 in the bowl 66 so that the shaft 106 passes through the holes 72, 116 in the front, and apertures 74, 116 in the rear. The holes 116 have a radius of 1–3 inches, and preferably are sized to correspond closely to the diameter of the shaft 106a or 106b passing through the hole.

Figure 7:
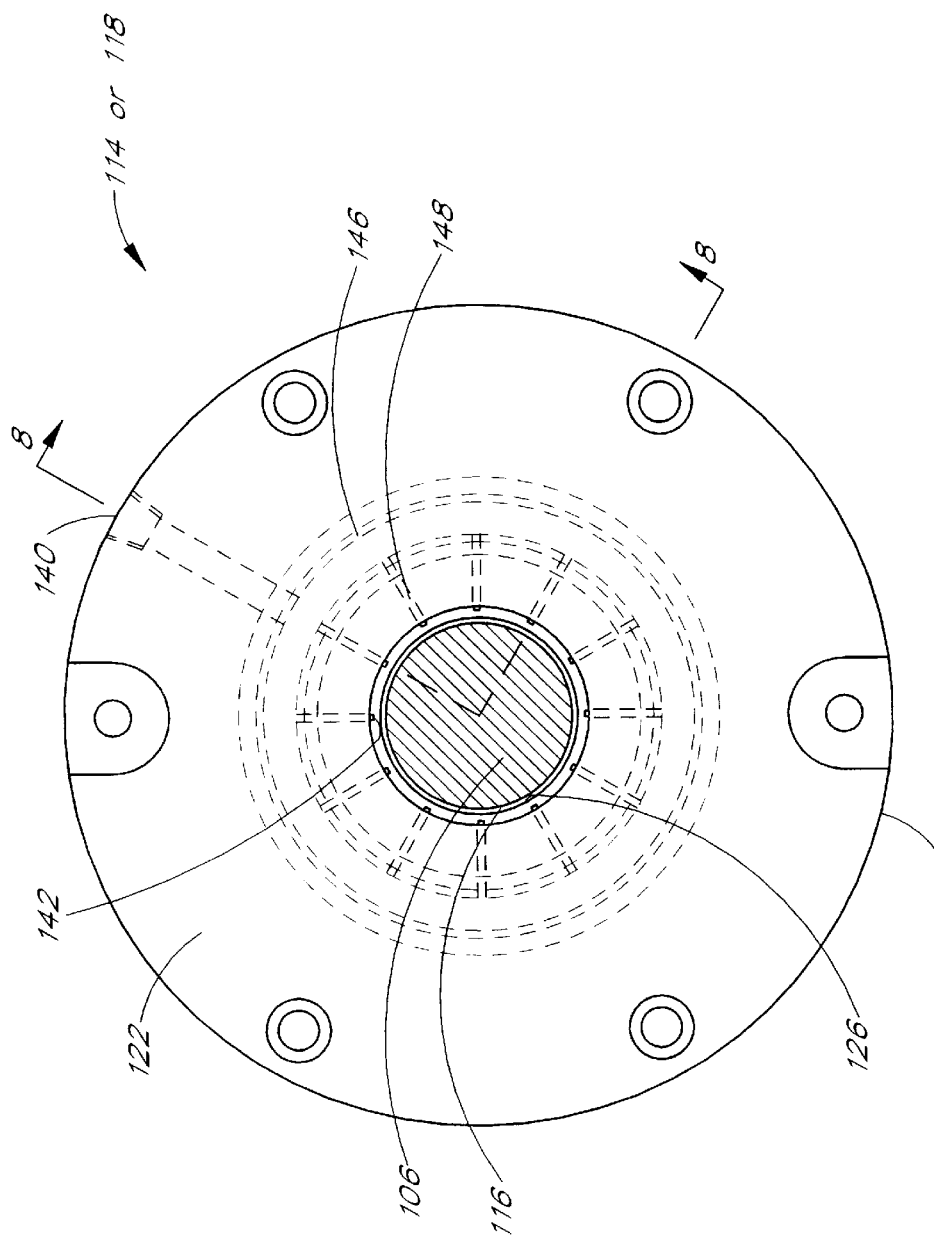
FIG. 7 is a plan view of a noncontacting seal used in a rinser-dryer illustrated in FIG. 1.
Figure 8:
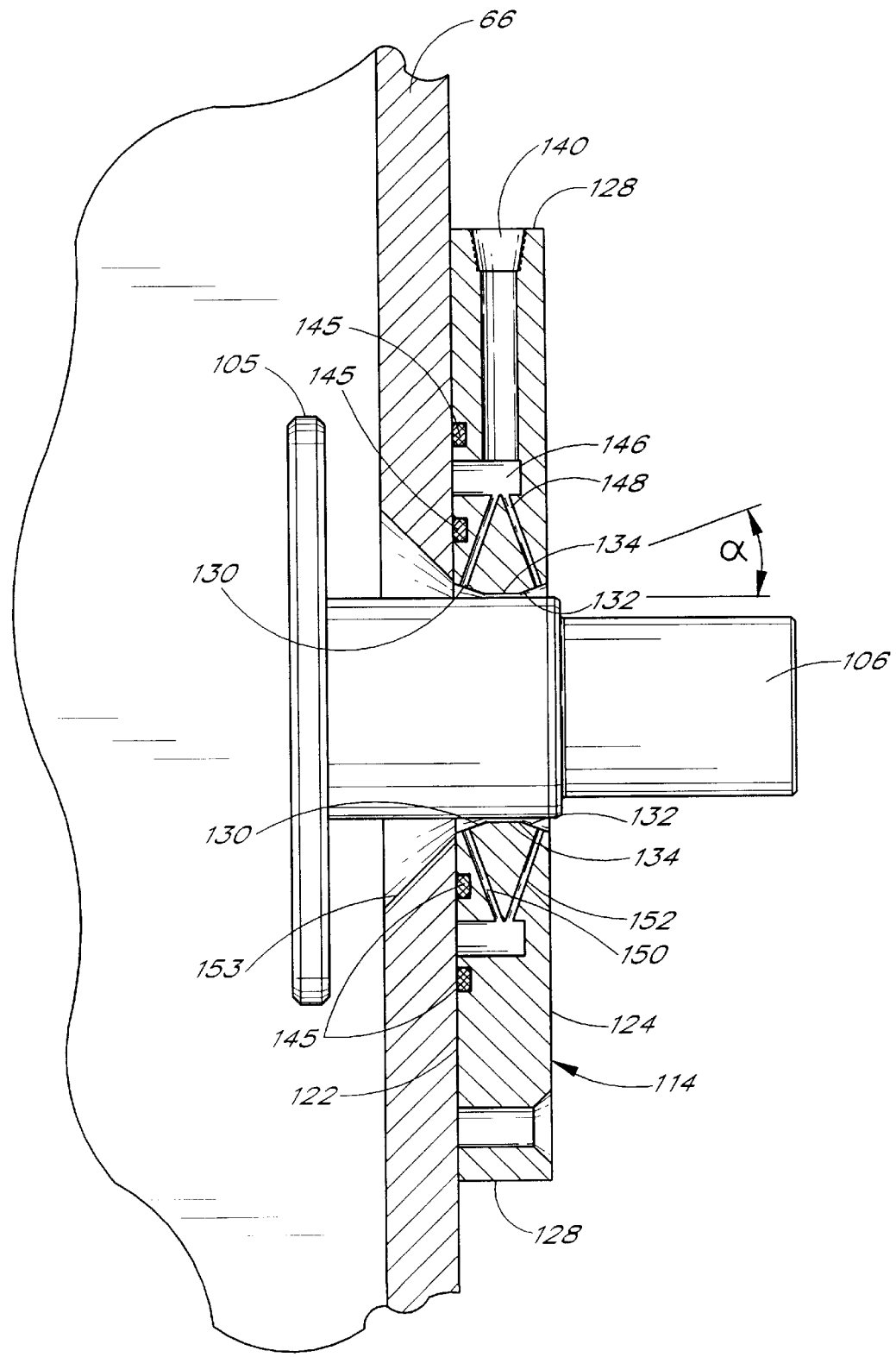
FIG. 8 is a cross sectional view of FIG. 7 along section 8—8.

FIGS. 7 and 8 illustrate a gas-purged seal design that is common to both the front and rear seal housing 114 and 118. Advantageously, both seals 114 and 118 are identical and differ only in regard to their position with respect to the frame 10 (front and rear). Thus, FIGS. 7 and 8 will detail only the front seal housing 114 and it is understood that the rear seal housing 118 is of the same construction as the front housing 114.

The seal housing 114 has an interior face 122 which faces toward and abuts the exterior of bowl 66, an exterior face 124 which faces away from the bowl 66, a hole 116 formed by the interior edge 126 of the housing 114 (FIG. 7) encircling the diameter of shaft 106, and an outer edge 128 of the housing 114. The faces 122 and 124 are substantially parallel, and the inner and outer edge 126, 128 are generally concentric to form a circular disk-shaped housing 114 with a central hole 116 (FIG. 7). The shape of the periphery of the hole 116 is preferably tapered in the longitudinal direction at an angle a of approximately 30°, opening away from axis X—X, and away from the center of housing 114, as best seen in FIG. 8. Thus, the edge 126 is not cylindrical for the full length of housing 114 along the X—X axis. An interior chamfer 130 is formed on the interior surface 122 of the housing 114 by the taper α. An exterior chamfer 132 is formed on the exterior surface 124 by the taper α. The angle α may range from about 10–50°, and thus the angle of chamfers 130, 132 will also vary.

The chamfers 130 and 132 form annular rings that are conical in shape with a triangular cross-section, and which form volumes encircling the shaft 106 that expand in volume as the distance to the adjacent end of the shaft 106 decreases. Although the chamfers 130 and 132 are preferably linear, they may be curved, curvilinear, or of other geometric configuration.

In cross-section, a middle portion or land 134 is located on the periphery of the hole 116 of the housing 114 between the interior and exterior chamfers 130 and 132. The land 134 is generally parallel to, and space slightly apart from the adjacent surface of circular shaft 106 to form an annular shaped gap between the shaft 106 and the opening 72 in the bowl 66 through which the shaft 106 passes. Preferably, the longitudinal length of the land 134 and chamfers 130 and 132 are relatively similar. That is, the length of the land 134 and chamfers 130 and 132 each comprise approximately one-third of the longitudinal length of the inner edge 126 of the housing 114. But, this configuration may vary to provide an avenue for fluid flow (as explained below) and include configurations where the land 134 is more than twice the length of either or both chamfers 130 and 132, or where either or both chamfers 130 and 132 are more than twice the length of the land 134. The land 34 as illustrated is about 0.1 to 0.4 inches long measured along the X—X axis, and is preferably less than 0.5 inches long. It is possible that the land 134 can be omitted with the chamfers 130 and 132 abutting each other.

As illustrated in FIGS. 7 and 8, a plurality of ports 142 open onto the surface of the chamfers 130 and 132 and are advantageously connected to a common inlet opening 140 formed in the outer edge 128 of the housing 114. The illustrated embodiment depicts one inlet port 140 and 12 outlet ports 142 in each chamfer. The ports 140 and 142 provide an avenue for gas flow. The outlet ports 142 are symmetrically located with respect to each other as viewed from the hole 116 in the housing 114 (e.g. FIG. 7). There is no requirement, however, that one inlet port and 12 outlet ports be used. Rather, one or more inlet port 140 and various combinations of outlet ports 142 may be used to provide an avenue for gas flow.

The connection of outlet ports 142 with inlet port 140 is formed by a plurality of paths within the housing 114. The inlet 140 extends radially inward toward the shaft 106 and communicates with a second path 146 that forms a ring which circumnavigates the diameter of the shaft 106. The path 146 can be formed by cutting a slot in the interior face 122 of the housing 114 and placing O-ring seals 145 on the radially interior and exterior sides of the slot. Thus, when the housing 114 is placed against the end 68 of the bowl 66, a closed, fluid-tight channel is formed around the hole 116 and shaft 106. The second path 146 is located approximately 2.5 inches from the outer edge 128 of the housing 114 and 1.5 inches from the hole 116 in the housing 114. The second path 146 communicates with one end of the plurality of outlet ports 142, with the ports 142 opening onto chamfers 130 and 132. The outlets 142 are formed in pairs (the illustrated embodiment depicts 12 pairs of outlets 142). That is, at each point where the feed channel 146 communicates with the outlet ports 142, two finger or sister paths 150 and 152 begin. The paths 150 and 152 are angled approximately 20° away from each other, with one path 150 proceeding toward the interior face 122 of the housing 114 and terminating at the interior chamfer 130 and the second path 152 proceeding toward the exterior face 124 of the housing 114 and terminating at the exterior chamfer 132. The outlet ports 142 have a diameter of about 0.01 to 0.1 inches.

A gas flow is introduced into the inlet port 140 by conventional means such as a pressurized nitrogen gas source and intake connector. Preferably, this gas flow is formed by nitrogen gas. Alternatively, other gases such as argon or ultra-dry pure air, which do not physically or chemically interact with the wafers and provide for contamination-free processing of the wafers would be adequate. Preferably, the gas is at a pressure of 30 psi and flow rate of 6 to 10 cfm, although that flow rate can vary at least ±10% for the depicted embodiment. Once the gas is introduced into the inlet port 140, the gas flows through the gas paths toward the outlet ports 142.

The outlet ports 142 formed on the interior chamfer 130 direct the gas flow toward the shaft 106 and toward the interior of the processing chamber 66. The edges of the holes 72 and 74 in the bowl 66 are also chamfered to form an annular ring having a conical shape around the shaft 106. The annular ring, among other things, minimizes the area where water may collect. The chamfer 153 is angled about 45 degrees from the rotational axis X—X of the shaft 106. A first pressure ridge is formed between the seal housing 114 and the shaft 106 by this gas flow. From this point and position, the gas flows through the openings 72 and 74 in the bowl 66 and into the bowl 66.

The outlet ports 142 formed on the exterior chamfer 132 direct the gas flow toward the shaft 106. The tapered angle of the exterior chamfer 132 and outlets 142 further direct this gas flow away from the opening 72 and 74 in the bowl 66. A second pressure ridge is formed between the housing 114 and the shaft 106 by this gas flow. From this point and position, the gas flows away from the opening 72 and 74 in the bowl 66 and away from the bowl 66.

The first and second pressure ridges form a barrier or gas-purged, noncontacting seal between the shaft 106 and the openings 74 and 72 in the bowl 66. There is, thus, advantageously provided a gas-purged, noncontacting seal around a rotating shaft 106 in which a land 134 is substantially parallel to the shaft and closely spaced to the shaft 106, with expanding openings at opposing ends of the land 134, and a gas injected into these openings in direction away from the land 134 and toward opposing ends of the shaft 106. The gap between the shaft 106 and land 134 is small, about 0.01 to 0.1 inches, and preferably does not exceed about 0.01 to 0.1 inches.

This seal design which incorporates dual chamfers 130 and 132 on opposing ends of land 134 allows the shaft 106 to pivot about the land 134 so that the shaft 106 can move without contacting the housing 114 and 118. Moreover, the design maintains a small clearance in the gas purged seal. While the above-described seal design is preferred, other gas purged seal designs are suitable for use with the mounting system described herein.

As illustrated in FIGS. 6, 9 and 10, the bowl 66 is supported on opposing ends 68 and 70 by shafts 106a and 106b that connect to the rotor 84 through the above-described gas pressurized seal. Referring to FIGS. 5 and 9, a front support 154 on bowl end 70 of the rinser dryer 8 includes a shaft housing 158, a housing plate 160, and an end plate 162. The shaft housing 158 advantageously takes the form of a suitable bearing that guides and supports the rotatable shaft 106. The housing plate 160 preferably forms a U-shaped bracket which fastens to the bowl 66 to secure and support the shaft housing 158. A plurality of threaded fasteners 170 connect the housing plate 160 to the bowl 66. The housing plate 160 may comprise a unitary member or other construction that secures and supports the shaft housing 158. There is thus provided a means for fastening the external end of shaft 106b to the outside end 70 of the processing chamber 66.

Referring to FIGS. 5, 9 and 10, the front and rear supports 154 and 156 are of similar construction and arrangement and the main difference between the front and rear supports 154 and 156 is the longitudinal positioning of the front support 154 toward the forward portion 12 of the frame 10 and the longitudinal positioning of the rear support 156 toward the rearward portion 14 of the frame 10, and the accommodation of the indexing mechanism 110. Thus, the rear support 156 similarly includes a shaft housing and housing plate for mounting the external end of shaft the 106a to the outside end 68 of the processing chamber 66. Thus, the motor 108 is directly mounted to the frame 10, and the ends of shaft 106 external to the bowl 66 are directly connected to the stiff ends 68 and 70 of bowl 66.

As illustrated in FIGS. 1, 9 and 10, a resilient mount is interposed between the bowl 66 and the connection of the bowl 66 to the frame 10. Specifically, a plurality of resilient mounts 176 are positioned along the exterior of the front and rear ends 68 and 70 of the bowl 66 and vertically positioned above the front and rear intermediate supports 39 and 44. The mounts 176 comprise tubes of a cylindrical resilient material. The mounts 176 have one end supported by the frame support 44 and the opposing end supporting a bracket 178 connected to the lower exterior portion of each end plate 68 and 70 of bowl 66. Each cylindrical mount 176 has a longitudinal hole so that a bolt 180 can extend through a corresponding hole in bracket 178, through the mount 176, and through a corresponding hole in the frame support 44, to position each mount 176 and act as a guide rod to restrain lateral movement.

The resilient members 176 which connect the bowl 66 and frame 10, are at least one order of magnitude (i.e., 10×) more flexible that the connection between the motor 108 and frame 10 and preferably two orders of magnitude (i.e., 100×) greater. Alternately phrased, the stiffness of the connectors between the motor 108 and frame 10 is at least 10 times greater that the stiffness of the connectors between the bowl 66 and frame 10 and preferably 100 times stiffer.

The mounts 176 are preferably constructed of neoprene and are about 0.7 to 1.3 inches high, 0.8 to 1.3 inches in outer diameter, and 0.2 to 0.4 inches in inner diameter. A neoprene with a standard durometer hardness reading of about 60 is believed suitable for the depicted embodiment, but other materials, such as composites, rubber, conventional and nonconventional springs of helical or other geometric designs or similar materials as will be understood by one skilled in the art may be used. The neoprene provides a resilient support and dampens the vibration of the bowl 66. In the illustrated embodiment there are 10 resilient members 176 on each end 68 and 70 of the bowl 66 to resiliently mount the bowl 66 to the support frame 10, along the vertical Y—Y axis, and to provide some motion dampening along that axis.

The vibration isolation device may also include a horizontal dampening element longitudinally located between the frame 10 and the bowl 66 to dampen vibration along the horizontal X—X axis. Further, a vertical dampening portion transversely located between the motor 108 and the floor can be added to dampen the vibratory motion transmitted to the floor and adjacent machinery. In the illustrated embodiment, the mounts 176 form both the horizontal and vertical portions of the vibration isolation device, but the vertical dampening along the Y—Y axis is much greater than along the other axes.

In the preferred embodiment, the bowl 66, is constructed of stainless steel to safely house the rotor 84. The bowl 66 may accommodate a removable liner. The rotor 84 may be constructed of stainless steel or other suitable material to support the wafers and accept a rotational force while not generating contaminants. The housings 114 and 118 are preferably constructed of steel or aluminum but may be constructed of metal composites or similar materials. For the rinser-dryer 8 configured for 12-inch wafers, the curved sides of the processing chamber 66 are made of ⅛ inch thick steel, with the ends 68 and 70 made of ½ inch thick steel. One end of the chamber 66 may be removable to allow the rotor 84 to be changed to accommodate different sizes of wafers and wafer carriers. The ends 86 and 88 of the rotor 84 are of ½ inch thick steel. The shaft 106 varies in diameter, but is about two inches in diameter. The rotor 84 and carrier 104 weigh about 150 pounds when full of wafers, and about 130 pounds empty. The rotating mass can thus vary from about 120 pounds to 180 pounds for the depicted rinser-dryer. Slight imbalances can thus cause substantial vibratory motion that risks damaging the wafers, generating particles, or transferring vibratory motion to adjacent equipment.

The above-described design has the external ends of the shaft 106 rigidly mounted to the processing chamber 66, which, in turn, is resiliently mounted to the frame 10 by mounts 176. This design allows the spring mounted bowl 66 to move with any imbalance of the rotor 84 and wafer carrier 104. The land 134 can advantageously be located at a vibrational node of the shaft 106 and rotor 84 assembly, to allow a close fit between the land 134 and rotating shafts 106*a* and 106*b*. More importantly, the shafts 106*a* and 106*b* are directly mounted to the ends 68 and 70 of bowl 66 within a short distance (1–3 inches, and 0.2–1 inches preferred) of the land 134 so the movement of the shafts 106 relative to the land 134 are reduced. By mounting the shafts 106*a* and 106*b* to the bowl 66 and resiliently mounting the bowl 66, the bowl 66 moves with the rotating components to further reduce undesirable relative motion between lands 134 and the adjacent shafts 106*a* and 106*b*. The drive motor 108 is rigidly mounted to the frame 10, but the coupler 112 accommodates misalignment between the shaft 106 and the motor 108 and helps decouple vibratory movement of the bowl 66 and shaft 106 from the motor 108. Further, this design, in combination with the frame design, creates less vibration transfer to the floor and thus reduces movement of adjacent machinery. It is believed to transfer less than half the vibration of a comparably sized system mounted in a conventional manner in which one resiliently mounts the motor and fixedly mount the bowl to the frame. A reduction in vibratory motion of the rinser-dryer 8, by at least a factor of 10, is believed possible.

The shafts 106*a* and 106*b* are connected to, or mounted from, the stiff ends 86 and 88 of rotor 84 by aluminum brackets about one inch thick. The brackets are spaced from the ends 86 and 88 only a distance sufficient to accommodate seal housings 114 and 118. The thin, flat design of the seal housings 114 and 118 help provide a shorter unsupported length of shafts 106, which provides a stiffer support for, and less movement of, the rotating mass. The design of the seals 114 and 118 also allows the land 134 to be placed close to the front and rear supports 154 and 156 that support the shafts 106*a* and 106*b* to reduce relative motion between the shafts 106 and the land 134. Advantageously, the lands 134 are within 1 inch of the end of the bearings supporting the rotating shaft 106. While the land 134 and chamfers 130, 132 comprise the preferred seal design, seals without chambers 130 or 132 could be used with the mounting system described herein.

The frame 10 is relatively stiff, with members 18, 20, 22, 24, 26, 28, 30 and 32 being made of 1"×2" steel tube that is ⅛ inch thick. Members 34 and 36 are 1"×1" steel tube, also ⅛ inch thick. Members 39 and 44, which connect to bowl 66, are preferably 1"×2" solid aluminum or stainless steel. The frame 10 is stiff relative to the resilient mounts 176, advantageously by at least a factor of 10 and preferably by a factor of 100.

By interposing the thin, gas-purged seals between the chamber walls and the bearings that support the rotation shaft 106, by mounting the seal 114 and 118 and bearings to the chamber, and by resiliently mounting the chamber, the chamber can move with and vibrate in unison with the rotating shaft 106 in order to reduce rotative motion between the shaft and the seal 114 and 118. This also reduces the vibration transferred through the frame 10 to the floor and adjacent equipment. While the illustrated rotor is shown supported by two shafts 106*a* and 106*b* on opposing ends, a single shaft, cantilevered configuration is believed suitable.

The embodiments illustrated and described above are provided merely as examples of the gas seal and support constructed in accordance with the present invention. Other changes and modifications can be made from the embodiments presented herein by those skilled in the art without departing from the spirit and scope of the invention as defined by the appended claims.

What is claimed is:

1. A semiconductor wafer processor, comprising:
    a rotor configured to hold at least one wafer during rotation about a rotational axis;
    a bowl enclosing the rotor, the bowl having opposing ends with a first hole in one end along the rotational axis;
    a first shaft connected to the rotor along the rotational axis and extending through the first hole in the bowl; and
    a seal connected to the bowl adjacent the first hole to encircle the first shaft, the seal having a land substantially parallel to and encircling the first shaft and closely spaced to that shaft, but not contacting the shaft, the seal further having a first and second side each on opposing ends of the land with the sides tapering away from the shaft and with a plurality of outlets in each side so the outlets are directed away from the land, the outlets being in fluid communication with at least one inlet to provide a flow of gas to the outlets to provide a non-contacting gas seal.

2. A processor as defined in claim 1, further comprising:
    a second shaft connected to the rotor along the rotational axis and extending through a second hole in the end of the bowl opposing the first hole; and
    a seal connected to the bowl adjacent the second hole to encircle the second shaft, the seal having a land substantially parallel to and encircling the second shaft and closely spaced to that shaft, the seal further having a first and second side each on opposing ends of the land with the sides tapering away from the second shaft and with a plurality of outlets in each side so the outlets are directed away from the land, the outlets being in fluid communication with at least one inlet to provide a flow of gas to the outlets.

3. A processor as defined in claim 1, further comprising a resilient mount interposed between the bowl and a support frame that supports the bowl on a floor, and a motor connected to the first shaft to rotate the rotor about the rotational axis.

4. A processor as defined in claim 3, wherein the stiffness of the connection between the motor and the support frame is at least 10 times greater than the stiffness of the resilient mount.

5. A processor as defined in claim 2, further comprising a resilient mount interposed between each opposing end of the bowl and a support frame that supports the bowl above a floor, and a motor connected to one of the shafts to rotate the rotor about the rotational axis.

6. A processor as defined in claim 5, wherein the stiffness of the connection between the motor and the support frame is at least 10 times greater than the stiffness of the resilient mount.

7. A processor as defined in claim 5, wherein the frame is at least 10 times stiffer than the connection between the bowl and the frame.

8. A processor as defined in claim 5, wherein the first and second shafts are mounted to the bowl such that the land is within one inch of an end of a bearing rotatably supporting the shaft.

9. A semiconductor wafer processor, comprising:
a rotating carrier configured to hold at least one wafer for rotation about a substantially horizontal rotational axis;
a bowl which houses the rotor and has a door through which wafers can be placed into the bowl;
a first shaft entering the bowl along the rotational axis and connecting to the rotor to rotate the carrier; and
a first seal surrounding the shaft and mounted to the bowl, the seal having an interior annular surface slightly larger than an adjacent diameter of the shaft, the seal having at least one chamfer located along one end of the interior annular surface with a plurality of outlet ports opening onto the chamfer and being in fluid communication with an inlet to provide a gas flow directed out of the at least one chamfer to form a first pressure ridge between the at least one chamfer and the first shaft to reduce migration of contaminants across the first pressure ridge.

10. A wafer processor as claimed in claim 9, wherein the rotor is supported on a first side by the first shaft and supported on a second side by a second shaft also mounted to the bowl, and further comprising a second seal surrounding the second shaft and mounted to the bowl, the seal having an interior annular surface slightly larger than an adjacent diameter of the second shaft, the second seal having at least one chamfer located along one end of the interior annular surface with a plurality of outlet ports opening onto the chamfer and being in fluid communication with an inlet to provide a gas flow directed out of the at least one chamfer to form a second pressure ridge between the at least one chamfer and the second shaft to reduce migration of contaminants across the second pressure ridge.

11. A wafer processor as claimed in claim 9, wherein the chamber is resiliently mounted to a support frame.

12. A wafer processor as claimed in claim 10, wherein the chamber is resiliently mounted to a support frame.

13. A wafer processor as claimed in claim 12, wherein the shaft is directly driven by a motor to rotate the shaft, and wherein the motor is mounted to the support frame.

14. A semiconductor processor, comprising:
a rotor configured to hold at least one wafer during rotation;
a nonrotating processing chamber enclosing the rotor and having a hole through which a shaft extends to connect to the rotor, the chamber being resiliently mounted to a support frame; and
a seal housing mounted to the chamber with an inner surface forming a hole through which the shaft extends, with one or more exhaust ports formed on the inner surface and in fluid communication with a gas inlet, the exhaust ports being placed on opposing sides of an annular land encircling the shaft and closely spaced to the shaft, wherein a gas flows through the gas inlet and out the exhaust port(s) which directs the gas in a direction away from the rotor and in a direction toward the rotor to reduce the passage of particulate matter through the seal housing, there being no contacting seal around the shaft between the seal housing and the rotor.

15. A semiconductor processor, comprising:
a rotor configured to hold a plurality of wafers for rotation about a rotational axis during processing;
a bowl enclosing the rotor during processing, the bowl having opposing ends with the first hole in one end along the rotational axis, and a second hole in the opposing end also along the rotational axis;
a first shaft connected to the rotor along the rotational axis and extending through the first hole in the bowl;
a second shaft connected to the rotor along the rotational axis and extending through the second hole in the bowl;
a noncontacting gas-purged seal mounted to the bowl and interposed between the bowl and each of the first and second shafts to reduce the passage of contaminants across the seals;
a support frame that supports the bowl above the floor;
a resilient mount interposed between each opposing end of the bowl and the support frame; and
a motor connected to one of the shafts to rotate the rotor about the rotational axis, said motor being mounted on said frame independently from said bowl and said resilient mount.

16. A semiconductor processor, comprising:
a rotor configured to hold a plurality of wafers for rotation about a rotational axis during processing;
a bowl enclosing the rotor during processing, the bowl having opposed ends with a first hole in one end along the rotational axis, and a second hole in the opposing end also along the rotational axis;
a first shaft connected to the rotor along the rotational axis and extending through the first hole in the bowl;
a second shaft connected to the rotor along the rotational axis and extending through the second hole in the bowl;
a non-contacting, gas-purged seal mounted to the bowl and interposed between the bowl in each of the first and second shafts to reduce the passage of contaminants across the seals;
a support frame that supports the bowl above a floor;
a resilient mount interposed between each opposing end of the bowl and the support frame; and
a motor connected to one of the shafts to rotate the rotor about the rotational axis;
wherein each seal is connected to the bowl adjacent one of the first or second holes to encircle the shaft extending through the hole, the seal having a land substantially parallel to and encircling the shaft and closely spaced to that shaft, the seal further having a first and second side each on opposing ends of the land with the sides tapering away from the shafts and with a plurality of outlets in each side so the outlets are directed away from the land, the outlets being in fluid communication with at least one inlet to provide a flow of gas to the outlets.

17. A processor as defined in claim 16, wherein the stiffness of the connection between the motor and the support frame is at least 100 times greater than the stiffness of the connection provided by the resilient mount.

18. A processor as defined in claim 16, wherein the rotational axis is horizontal.

19. A method for sealing a rotating shaft in a semiconductor wafer processor, comprising the steps of:
providing a rotor configured to hold at least one wafer during rotation about a rotational axis;
providing a bowl enclosing the rotor having opposing ends with a first hole in one end along the rotational axis;
providing a first shaft connected to the rotor along the rotational axis and extending through the first hole in the bowl; and providing a seal connected to the bowl adjacent the first hole to encircle the first shaft and having a land substantially parallel to and encircling the first shaft and closely spaced to that shaft, the seal further having a first and second side each on opposing ends of the land with the sides tapering away from the shaft and with a plurality of outlets in each side so the outlets are directed away from the land, the outlets being in fluid communication with at least one inlet to provide a flow of gas to the outlets.

20. A method as defined in claim 18, further comprising the steps of:

providing a second shaft connected to the rotor along the rotational axis and extending through a second hole in the end of the bowl opposing the first hole; and providing a seal connected to the bowl adjacent the second hole to encircle the second shaft, providing the seal with a land substantially parallel to and encircling the second shaft and closely spaced to that shaft, the seal further having a first and second side each on opposing ends of the land with the sides tapering away from the second shaft and with a plurality of outlets in each side so the outlets are directed away from the land, the outlets being placed in fluid communication with at least one inlet to provide a flow of gas to the outlets.

21. A method as defined in claim 19, further comprising the steps of:

providing a resilient mount interposed between each opposing end of the bowl and a support frame that supports the bowl above a floor;

connecting a motor to the first shaft to rotate the rotor about the rotational axis; and connecting the motor to the support frame with a stiffness at least ten times greater than the stiffness of the connection that the resilient mount provides to the bowl.

22. A method as defined in claim 21, wherein the connecting step comprises making the stiffness of the connection between the motor and the support frame at least 100 times greater than the stiffness of the resilient mount.

23. A method as defined in claim 19, comprising the steps of interposing a resilient mount between each opposing end of the bowl and a support frame that supports the bowl above a floor, and further connecting a motor to one of the shafts to rotate the rotor about the rotational axis.

24. A method as defined in claim 19, wherein the connecting step provides a connection between the motor and the support frame at least 100 times stiffer than the stiffness of the connection to resilient mount.

25. A method for supporting a rotor for rotating wafers in a semiconductor processor enclosed by a chamber, wherein the rotor is connected to a first shaft extending through a first hole in the chamber to be driven by a motor, comprising the steps of:

encircling a first shaft with a non-contacting gas seal, to form a first gas path toward the chamber and a second gas path away from the chamber along the first shaft;

supporting the first shaft by bearings mounted to the chamber adjacent the first hole;

interposing the first gas seal between the bearing and the chamber;

resiliently mounting the chamber to a support frame; and mounting the motor to the support frame independently from the resilient mount for the chamber.

26. A method as defined in claim 25, comprising the further steps of:

connecting a second shaft to the rotor through a second hole in the chamber so the first and second shafts rotate about a common axis;

encircling a diameter of the second shaft with a second non-contacting gas seal to form a third gas path toward the chamber along the second shaft and to form a fourth gas path away from the chamber along the second shaft;

supporting the second shaft by second bearings mounted to the chamber adjacent the second hole; and interposing the second gas seal between the second bearing and the chamber.

27. The processor of claim 15 wherein said motor is rigidly mounted to said frame.

28. The processor of claim 15 wherein the frame is at least ten times stiffer than the connection between the bowl and the frame.

29. The processor of claim 15 wherein said resilient mount includes a bracket connected to each end of the bowl and a plurality of resilient members connected between the bracket and the frame.

30. The method of claim 25, wherein said motor mounting step comprises mounting the motor rigidly to the frame.

31. The method of claim 25, wherein said chamber mounting step includes mounting a bracket on opposing ends of the chamber and connecting a plurality of resilient members to the bracket and to the frame.

* * * * *